(12) United States Patent
Miyatake et al.

(10) Patent No.: US 7,952,950 B2
(45) Date of Patent: May 31, 2011

(54) SEMICONDUCTOR DEVICE INCLUDING ANTI-FUSE CIRCUIT, AND METHOD OF WRITING ADDRESS TO ANTI-FUSE CIRCUIT

(75) Inventors: Shinichi Miyatake, Tokyo (JP); Sumio Ogawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 226 days.

(21) Appl. No.: 12/289,196

(22) Filed: Oct. 22, 2008

(65) Prior Publication Data

US 2009/0109790 A1   Apr. 30, 2009

(30) Foreign Application Priority Data

Oct. 29, 2007  (JP) ................................ 2007-280820
Oct. 29, 2007  (JP) ................................ 2007-280821
Oct. 29, 2007  (JP) ................................ 2007-280822

(51) Int. Cl.
  *G11C 17/18*  (2006.01)
(52) U.S. Cl. ...................... 365/225.7; 365/200; 365/201
(58) Field of Classification Search ............... 365/225.7, 365/200, 201
See application file for complete search history.

(56) References Cited

U.S. PATENT DOCUMENTS

| | | | |
|---|---|---|---|
| 5,929,691 | A | 7/1999 | Kim et al. |
| 6,188,239 | B1 * | 2/2001 | Merritt ............................ 326/38 |
| 7,159,141 | B2 * | 1/2007 | Lakhani et al. .................... 714/8 |
| 7,339,848 | B1 * | 3/2008 | Stansell et al. ............. 365/225.7 |
| 7,362,159 | B2 | 4/2008 | Fukuda |
| 2004/0148329 | A1 | 7/2004 | Ogasawara et al. |
| 2006/0114052 | A1 | 6/2006 | Fukuda |
| 2007/0097773 | A1 * | 5/2007 | Nishioka et al. ........... 365/225.7 |

FOREIGN PATENT DOCUMENTS

| | | |
|---|---|---|
| JP | 10-075170 | 3/1998 |
| JP | 2004-227361 | 8/2004 |
| JP | 2006-147651 | 6/2006 |

* cited by examiner

*Primary Examiner* — Huan Hoang
(74) *Attorney, Agent, or Firm* — McGinn IP Law Group, PLLC

(57) ABSTRACT

An anti-fuse circuit according to the present invention includes an anti-fuse element that holds data in a nonvolatile manner and a latch circuit that temporarily holds data to be written to the anti-fuse element. The writing to the latch circuit can be performed in the order of nanoseconds, and thus, even when the defective addresses respectively different are written in a plurality of chips, a writing process to the latch circuit can be completed in a very short period of time. Thereby, an actual process for writing to the anti-fuse element can be performed in parallel for the chips, and as a result, the process for writing to the anti-fuse element can be performed at high speed.

26 Claims, 14 Drawing Sheets

FIG.10

SEMICONDUCTOR DEVICE INCLUDING ANTI-FUSE CIRCUIT, AND METHOD OF WRITING ADDRESS TO ANTI-FUSE CIRCUIT

BACKGROUND OF THE INVENTION

1. Field of the Invention

The present invention relates to an anti-fuse circuit and a semiconductor device including the same, and, more particularly relates to an anti-fuse circuit capable of performing a writing operation to an anti-fuse element at high speed and a semiconductor device including the same. The present invention also relates to a method of writing an address to such an anti-fuse circuit.

2. Description of Related Art

In a semiconductor device such as a DRAM (Dynamic Random Access Memory), a defective cell that does not operate properly is replaced by a redundant cell to repair a defective address. In storing the defective address, generally, a fuse element is used (see Japanese Patent Application Laid-open Nos. H10-75170 and 2006-147651). The fuse element in an initial state is electrically conductive. When the fuse element is cut by a laser-beam irradiation, the defective address can be stored in a nonvolatile manner. Accordingly, when a plurality of such fuse elements are arranged to cut a desired fuse element, it becomes possible to store a desired address. Thus, the conventional fuse element stores information in a nonvolatile manner by changing from a conductive state to an insulating state.

On the other hand, recently, an element called an anti-fuse element gains a focus of attention (Japanese Patent Application Laid-open No. 2004-227361). Contrary to the conventional fuse element, the anti-fuse element stores the information by changing from the insulating state to the conductive state. Writing of the information to the anti-fuse element is performed by dielectric breakdown caused by applying a high voltage. Thus, unlike the conventional fuse element, the laser-beam irradiation is not necessary when writing. This leads to a high-speed writing of the defective address and eliminates an apparatus such as a laser trimmer. In addition, breaking of a passivation film resulting from the laser-beam irradiation does not occur, and therefore product reliability can also be increased.

The writing of the defective address to the anti-fuse element is performed after an operation test in a wafer state. The operation test in a wafer state is not performed on each chip, but generally, the test is performed on a plurality of chips in parallel. That is, when a clock terminal, an address terminals, and a command terminals are each commonly connected among a plurality of chips, which are subject to the test, a clock signal, an address signal, and a command signal common to these chips are applied, and in this state, a data writing or a data reading is actually performed. At least output data need to be individual for each chip, and therefore, needless to say, a data input/output terminal is not commonly connected.

As described above, at a time of the operation test in a wafer state, the address terminals are commonly connected among the chips, which are subject to test, and due to this reason, an individual address cannot be supplied to each chip. However, needles to say, the detected defective address differs depending on each chip. Accordingly, it is necessary to perform the writing operation of the defective address individually on each chip, and therefore the writing operation cannot be performed in parallel. That is, while the operation test can be performed in parallel for the chips, the writing operation of the defective address has to be individually performed on each chip.

The writing operation of the defective address to the anti-fuse circuit can be performed at higher speed as compared to the writing operation of the defective address to the fuse element by laser-beam irradiation. However, the writing to the anti-fuse circuit is performed by the dielectric breakdown caused by applying the high voltage, and therefore, as compared to normal data input/output, it takes a very long time. As one example, when there are 1000 fuse sets each capable of storing one defective address and a writing time for one fuse set is 5 milliseconds (ms), it requires about 5 seconds per chip to perform writing to all the fuse sets.

A resistance of the anti-fuse element that undergoes the dielectric breakdown greatly deviates depending on a level of the dielectric breakdown or a generation location. Therefore, in some cases, there is a case that the resistance after the dielectric breakdown is in the order of megaohms (MΩ). In this case, it becomes difficult to determine whether the anti-fuse element is broken. However, in a fuse set in which the writing of the defective address is once performed, an enable fuse indicating whether the fuse set is used is also broken, and therefore this fuse set cannot be restored to an unused state. There arises a problem that when the writing of the defective address is unsuccessful, the entire chip needs to be abandoned.

SUMMARY

The present invention seeks to solve one or more of the above problems, or to improve upon those problems at least in part.

In one embodiment, a semiconductor device having an anti-fuse circuit, the anti-fuse circuit comprises: an anti-fuse element that permanently stores data; and a latch circuit that temporarily stores data to be written into the anti-fuse element.

According to this embodiment, it is possible to actually perform a writing process to an anti-fuse element after data to be written to the anti-fuse element is once written to a latch circuit. The writing to the latch circuit can be performed in the order of nanoseconds, and thus, even when the defective addresses each different are written to a plurality of chips, the writing process to the latch circuit can be completed in a very short period of time. Thereby, the actual writing process to the anti-fuse element can be performed in parallel for the chips, and as a result, the writing process to the anti-fuse element can be performed at high speed.

It is preferable that the anti-fuse circuit according to this embodiment further includes a write transistor connected between the latch circuit and the anti-fuse element and a control circuit that controls at least the write transistor. Preferably, the control circuit turns off the write transistor at a time of causing the latch circuit to temporarily hold the data and turns on the write transistor at a time of writing the data held in the latch circuit to the anti-fuse element. According thereto, at a time of the set operation, the latch circuit and the anti-fuse element can be separated. Therefore, the set operation to the latch circuit can be performed at high speed and surely.

It is preferable that the anti-fuse circuit according to the present invention further includes a sense circuit that reads the data written in the anti-fuse element and a read transistor connected between the anti-fuse element and the sense circuit. Preferably, the control circuit turns on the read transistor and turns off the write transistor at a time of reading the data written in the anti-fuse element. According thereto, the latch circuit and the anti-fuse element can be separated at a time of the sense operation, and therefore the sense operation can be performed at high speed and surely.

In another embodiment, a semiconductor device having an anti-fuse circuit, address terminals and data terminals, the anti-fuse circuit comprises: a plurality of fuse sets including an anti-fuse element that permanently stores data; and a control circuit that writes a defective address supplied via the address terminals into one of the fuse sets designated by a repair set address supplied via the data terminals.

According to this embodiment, the repair set address is received via the data terminal, and therefore the writing of the defective address can be performed in parallel on a plurality of chips. Thus, the writing process of the defective address can be performed at high speed.

In still another embodiment, a semiconductor device having an anti-fuse circuit, the anti-fuse circuit comprises: a plurality of fuse sets each includes an anti-fuse element that permanently stores data, wherein each of the fuse sets includes: a plurality of bit-storage circuits that store a defective address; and a disable circuit that invalidates the defective address stored in the bit-storage circuits.

According to this embodiment, each fuse set includes a disable circuit, and therefore the fuse set on which the writing of the defective address is performed once can be thereafter invalidated. Thus, even when the writing of the defective address is unsuccessful, necessity of abandoning the entire chip is eliminated.

As described above, according to the present invention, the process for writing to the anti-fuse element can be performed at high speed.

BRIEF DESCRIPTION OF THE DRAWINGS

The above features and advantages of the present invention will be more apparent from the following description of certain preferred embodiments taken in conjunction with the accompanying drawings, in which:

FIG. 10 is a table of one example of a change of each signal at a time of the set operation;

DETAILED DESCRIPTION OF THE PREFERRED EMBODIMENTS

Preferred embodiments of the present invention will now be explained in detail with reference to the drawings.

Figure 1:
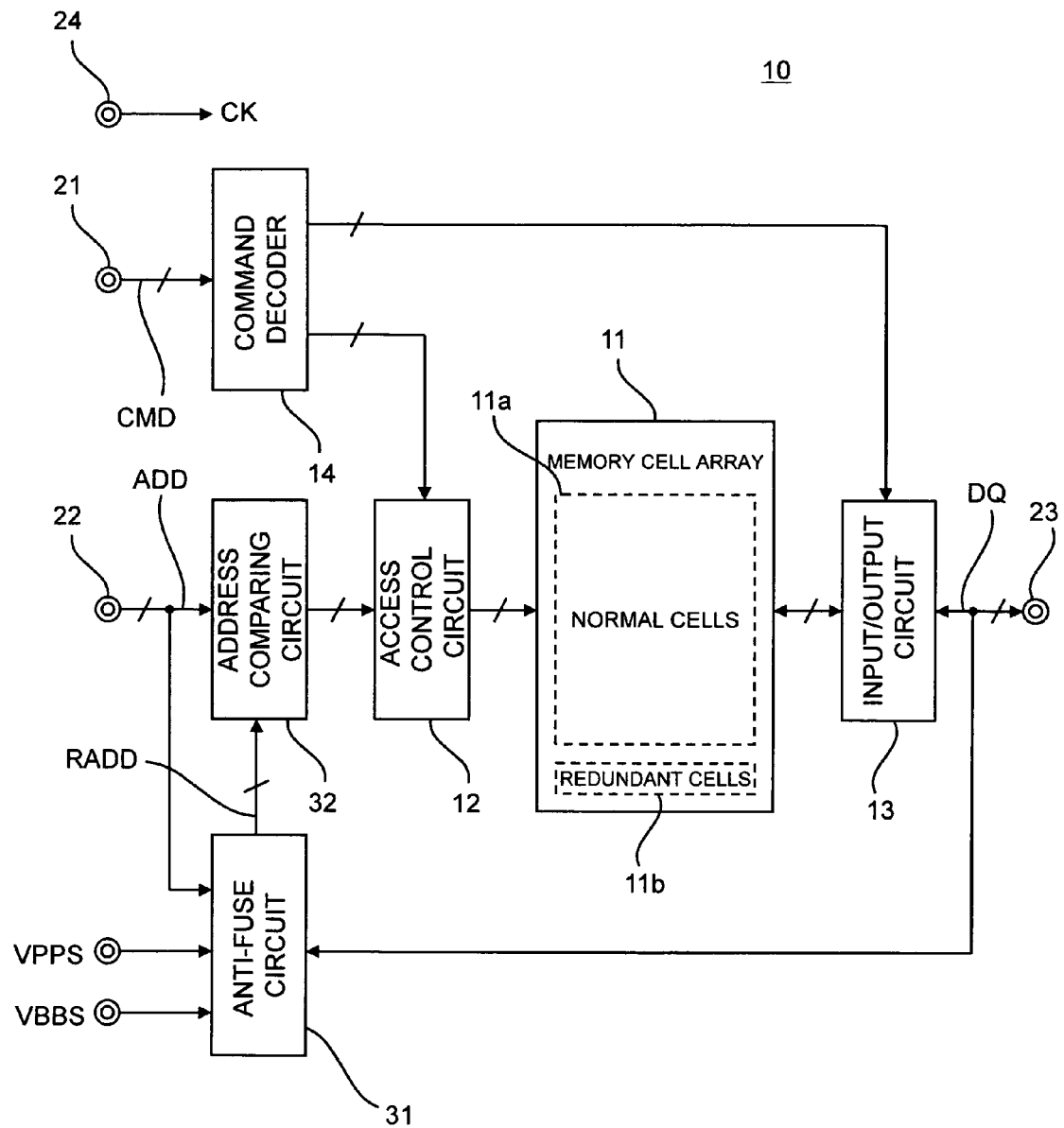
FIG. 1 is a block diagram showing a configuration of a semiconductor device according to a preferred embodiment of the present invention.

FIG. 1 is a block diagram showing a configuration of a semiconductor device 10 according to a preferred embodiment of the present invention. The semiconductor device 10 according to the present embodiment is a semiconductor memory such as a DRAM.

The semiconductor device 10 according to the present embodiment includes a memory cell array 11 including a plurality of memory cells, an access control circuit 12 that performs access control for the memory cell array 11, an input/output circuit 13 that performs input/output control of data to and from the memory cell array 11, and a command decoder 14 that receives a command signal CMD. As shown in FIG. 1, the memory cells included in the memory cell array 11 are classified into a normal cell 11a and a redundant cell 11b. The redundant cell 11b is used for repairing a defective address by replacing the defective normal cell 11a.

The semiconductor device 10 according to the present embodiment has a various external terminals including a plurality of command terminals 21, a plurality of address terminals 22, and a plurality of data terminals 23. The command terminals 21 are supplied with the command signal CMD, and the address terminals 22 are supplied with an address signal ADD. The data terminals 23 output read data DQ and input write data DQ. In addition to these external terminals, a clock terminal 24 to which a clock signal CK is inputted, a power supply terminal (not shown) or the like are provided.

An operation of the semiconductor device 10 at a time of a normal operation is designated by a combination of command signals CMD. For example, when the command signal CMD indicates a read operation, a read signal is internally generated by the command decoder 14, and when the command signal CMD indicates a write operation, a write signal is internally generated by the command decoder 14. These internal commands are supplied to the access control circuit 12 or the input/output circuit 13.

When the read signal is internally generated, data stored in an address designated by the address signal ADD, out of data stored in the memory cell array 11, is accessed, and the read-out read data DQ is outputted to the data terminal 23. The access to the memory cell is controlled by the access control circuit 12, and the output of the read data DQ is controlled by the input/output circuit 13. On the other hand, when the write signal is internally generated, the write data DQ inputted to the data terminal 23 is fetched to the input/output circuit 13, and by under the control of the access control circuit 12, the fetched data is written to an address designated by the address signal ADD.

As shown in FIG. 1, the semiconductor device 10 further includes an anti-fuse circuit 31 and an address comparing circuit 32. In the anti-fuse circuit 31, an address (a defective address RADD) of the defective normal cell 11a is stored, and as described later, a plurality of anti-fuse sets are included therein.

An address comparing circuit 32 compares the defective address RADD stored in the anti-fuse circuit 31 with the address signal ADD supplied via the address terminal 22. A comparison result is supplied to the access control circuit 12. The access control circuit 12 accesses the normal cell 11a when a matching is not detected by the address comparing circuit 32, and accesses the redundant cell 11b when the matching is detected. Thereby, the defective address is repaired.

A configuration of the anti-fuse circuit 31 is described next in detail.

Figure 2:
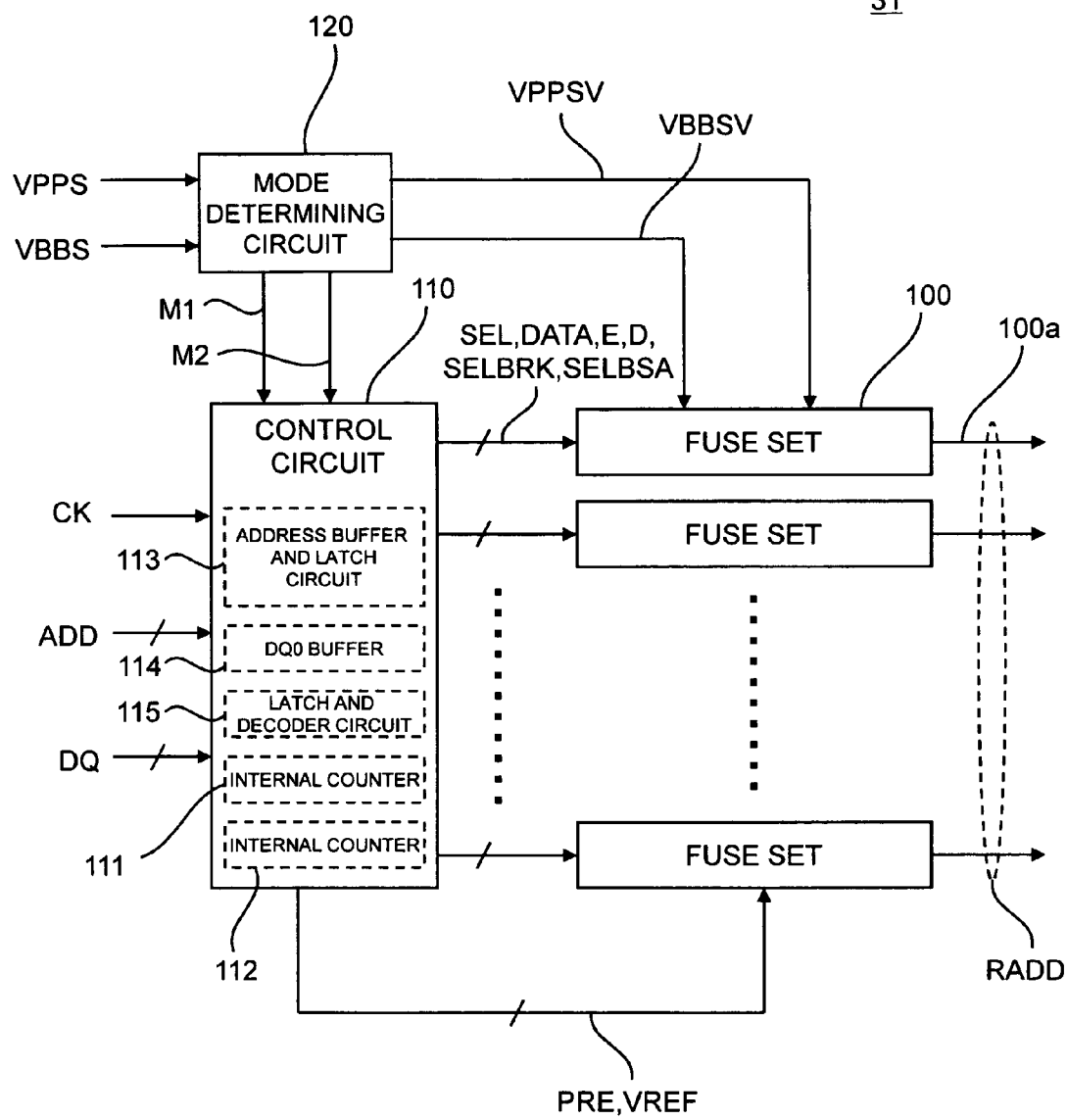
FIG. 2 is a block diagram showing a circuit configuration of an anti-fuse circuit shown in FIG. 1.

FIG. 2 is a block diagram showing a circuit configuration of the anti-fuse circuit 31.

As shown in FIG. 2, the anti-fuse circuit 31 includes a plurality of fuse sets 100 that store the defective address, a control circuit 110 that controls operations of the fuse sets 100, and a mode determining circuit 120 that determines an operation mode to be entered.

The fuse sets 100 are circuits each capable of storing one address in a nonvolatile manner. Accordingly, the anti-fuse circuit 31 is capable of storing the defective addresses of which the number is same as that of the fuse sets 100. A specific number of fuse sets 100 differs depending on a product. In many cases, about 1000 sets of fuse sets are arranged, for example. A specific circuit configuration of each fuse set 100 is described later.

The mode determining circuit 120 determines the operation mode to be entered, based on voltage supplied to external terminals VPPS and VBBS. In the present embodiment, at least a "set mode", a "write mode", and a "sense mode" are provided as the operation mode.

The "set mode" is a mode for temporarily latching the defective address to the fuse set 100. In this mode, the anti-fuse element is not broken. The "write mode" is a mode for actually breaking the anti-fuse element, and is entered after latching the defective address in the set mode. The "sense mode" is a mode for reading the defective address written in the fuse set 100, and in an actually used state, this mode is entered all the time.

Although not particularly limited, in the present embodiment, when 3 V and 0 V are respectively applied to the external terminals VPPS and VBBS, the "set mode" can be entered, and when 4 V and −2 V are respectively applied to the same terminals, the "write mode" can be entered. When both the external terminals VPPS and VBBS are brought to an opened state, the "sense mode" can be entered. Both the external terminals VPPS and VBBS are not used in the actually used state, and are used only at a time of an operation test performed in a wafer state. Accordingly, the external terminals VPPS and VBBS are in an opened state all the time in the actually used state.

When the set mode is entered, the mode determining circuit 120 sets both mode signals M1 and M2 to a high level, and in response thereto, the control circuit 110 performs an operation at a time of the set mode. Further, the mode determining circuit 120 respectively sets levels of operation voltages VPPSV and VBBSV, to supplied voltages to the external terminals VPPS and VBBS, i.e., 3 V and 0 V, respectively, and supplies the voltages to each of the fuse sets 100.

When the write mode is entered, the mode determining circuit 120 sets the mode signal M1 to a high level and sets the mode signal M2 to a low level, and in response thereto, the control circuit 110 performs an operation at a time of the write mode. Further, the mode determining circuit 120 respectively sets levels of operation voltages VPPSV and VBBSV, to supplied voltages to the external terminals VPPS and VBBS, i.e., 4 V and −2 V, respectively, and supplies the voltages to each of the fuse sets 100.

When the sense mode is entered, the mode determining circuit 120 sets the mode signal M1 to a low level and sets the mode signal M2 to a high level, and in response thereto, the control circuit 110 performs an operation at a time of the sense mode. Further, the mode determining circuit 120 sets both levels of the operation voltages VPPSV and VBBSV, to a VSS level.

Figure 3:
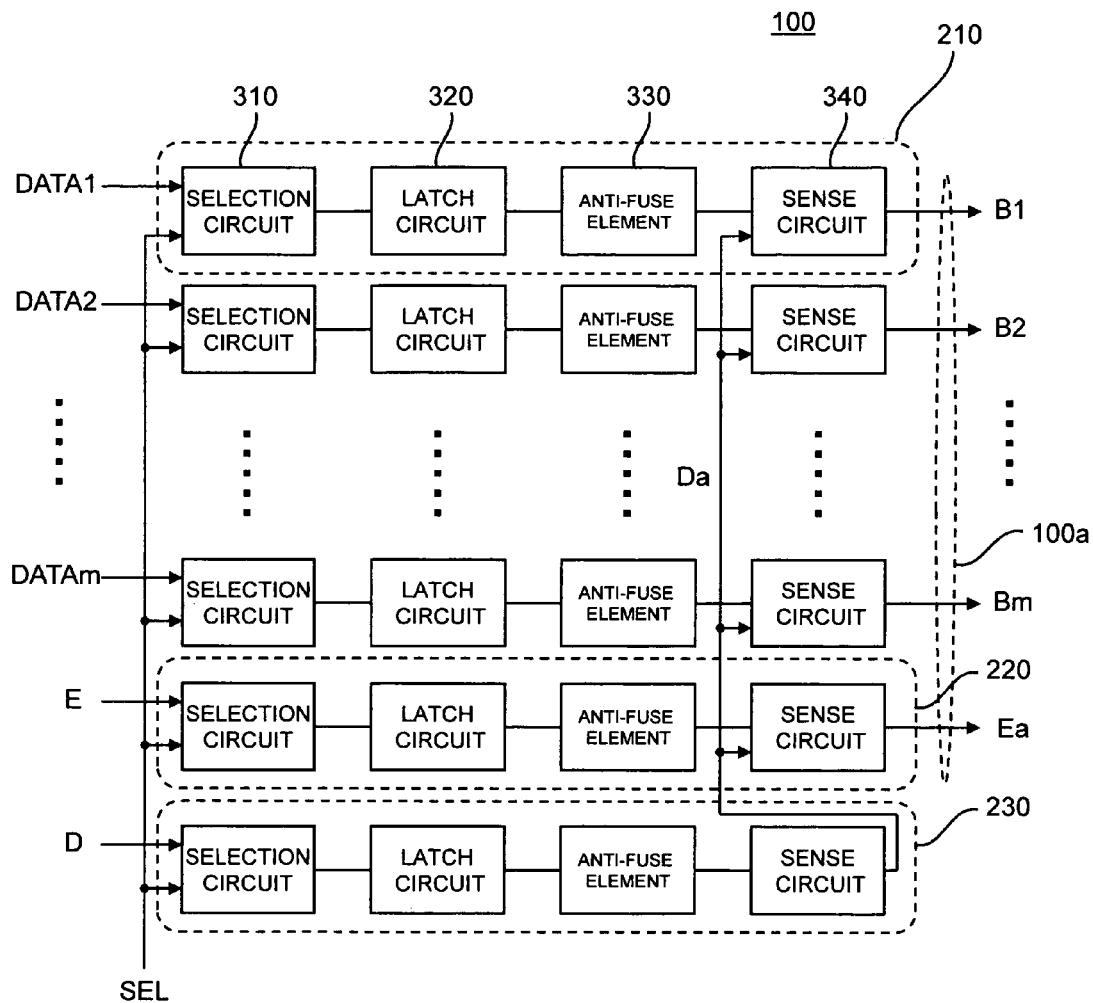
FIG. 3 is a block diagram showing a circuit configuration of a fuse set shown in FIG. 2.

FIG. 3 is a block diagram showing a circuit configuration of the fuse set 100.

As shown in FIG. 3, one fuse set 100 includes m bit-storage circuits 210, an enable circuit 220, and a disable circuit 230. The bit-storage circuits 210 each correspond to one bit of the defective address to be stored. Accordingly, the number (=m) of bit-storage circuits 210 included in one fuse set 100 is equal to (or more than) the number of bits of the address to be stored.

The enable circuit 220 is activated when validating the fuse set 100, and the disable circuit 230 is activated when invalidating the fuse set 100. The disable circuit 230 has a higher priority than the enable circuit 220, and accordingly, when both the enable circuit 220 and the disable circuit 230 are activated, the fuse set 100 is invalidated. Also when both the enable circuit 220 and the disable circuit 230 are inactive, the fuse set 100 is invalidated.

The bit-storage circuits 210 and the enable circuit 220 have the same circuit configuration to each other. The disable circuit 230 has basically the same circuit configuration as the bit-storage circuits 210 and the enable circuit 220. More specifically, as shown in FIG. 3, these circuits are each configured by: a selection circuit 310; a latch circuit 320; an anti-fuse element 330; and a sense circuit 340. The selection circuits 310 are activated when the fuse set 100 is selected, and are respectively inputted corresponding bit signals DATA1 to DATAm, enable signal E, and disable signal D. The latch circuit 320 temporarily holds data to be written to the anti-fuse element 330.

Bit signals B1 to Bm, which are outputs of the sense circuit 340, indicate one defective address. When an enable signal Ea is active, the defective address is valid. A disable signal Da is supplied to the sense circuits 340 included in the bit-storage circuits 210 and the enable circuit 220. When the disable signal Da is active, the sense circuits 340 included in the bit-storage circuits 210 and the enable circuit 220 are brought into an inactive state and thereby the defective address is invalid. The output 100a from one fuse set 100 is configured by the bit signals B1 to Bm and the enable signal Ea. As shown in FIG. 2, a group of these outputs 100a is the defective address RADD.

Figure 4:
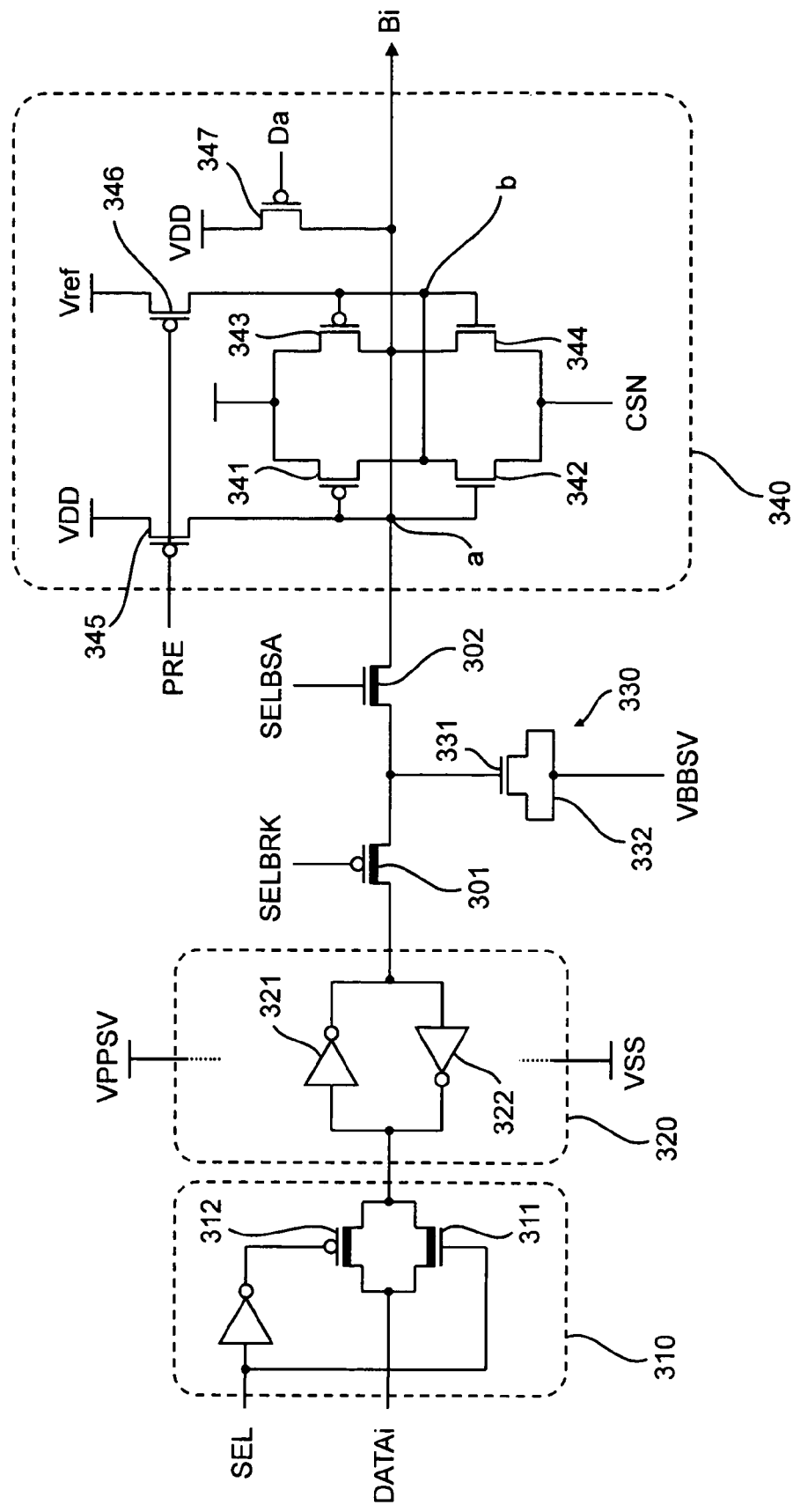
FIG. 4 is a specific circuit diagram of a bit-storage circuit shown in FIG. 3.

FIG. 4 is a specific circuit diagram of the bit-storage circuit 210.

As shown in FIG. 4, the selection circuit 310 included in the bit-storage circuit 210 has a transfer gate configuration in which an n-channel MOS transistor 311 and a p-channel MOS transistor 312 are connected in parallel. Gates of the transistors 311 and 312 are supplied with a corresponding selection signal SEL and an inverted signal of the selection signal SEL. The selection signal SEL is a signal for selecting the desired fuse set 100, and accordingly, the selection signal SEL different depending on each fuse set 100 is assigned. With such a configuration, when the selection signal SEL is activated to a high level, a corresponding bit signal DATAi (i=1 to m) is supplied to the latch circuit 320.

The latch circuit 320 has a so-called flip-flop configuration in which two inverters 321 and 322 are connected in circulation. Accordingly, when the selection signal SEL is activated, the bit signal DATAi is temporarily stored in the latch circuit 320. Needles to say, the writing to the latch circuit 320 can be performed at a very high speed unlike the writing to the anti-fuse element. As shown in FIG. 4, the latch circuit 320 is supplied with operation voltage VPPSV generated by the mode determining circuit 120.

Output of the latch circuit 320 is supplied via a write transistor 301 to the anti-fuse element 330. The anti-fuse element 330 has a configuration in which a source and a drain of an MOS transistor are short-circuited. A gate 331 of the anti-fuse element 330 is supplied with the output of the latch circuit 320, and a source/drain 332 is supplied with the operation voltage VBBSV generated by the mode determining circuit 120.

In the anti-fuse element 330 in an initial state, the gate 331 and the source/drain 332 are insulated via a gate insulting film, and therefore no current is passed therebetween. However, when a high voltage is applied between the gate 331 and the source/drain 332, the dielectric breakdown occurs in the gate insulating film, and thereby, a current pass is formed therebetween. After the dielectric breakdown of the gate insulating film, the breakdown cannot be restored to an original state, and accordingly, irreversible nonvolatile writing is possible. The gate 331 of the anti-fuse element 330 is connected via a read transistor 302 to the sense circuit 340.

All the transistors configuring the selection circuit 310 and the latch circuit 320 and the transistors 301 and 302 shown in FIG. 4 have a withstanding structure having a thicker gate insulating film, as compared to the other transistors. On the other hand, the transistor configuring the anti-fuse element 330 is a normal transistor configuring the sense circuit 340 and other internal circuits, and is set such that a thickness of the gate insulating film is thin. The reason for this is to prevent the selection circuit 310 and the latch circuit 320 from undergoing dielectric breakdown at a time of the dielectric breakdown of the anti-fuse element 330. When the gate insulating film is thickened, a performance as a transistor is decreased. However, even when operation speeds of the selection circuit 310, the latch circuit 320 or the like slightly decrease, there occurs almost no problem in practice.

Similar to the latch circuit 320, the sense circuit 340 has a so-called flip-flop configuration in which an inverter formed of the transistors 341 and 342 and an inverter formed of the transistors 343 and 344 are connected in circulation. Sources of the transistors 342 and 344 are supplied with a sense signal CSN. The sense signal CSN is set to a VDD level in a period during which a state of the anti-fuse element 330 is read, and set to a VSS level at a time of performing a sense operation. A node "a" connected to gates of the transistors 341 and 342 is connected via the read transistor 302 to the gate 331 of the anti-fuse element 330, and used as an output end of the bit-storage circuit 210. Instead of the node "a", a node "b" connected to gates of the transistors 343 and 344 can be used as the output end.

The nodes "a" and "b" are supplied with a power voltage VDD and a reference voltage Vref via the transistors 345 and 346, respectively. The transistors 345 and 346 are turned on when a precharge signal PRE is activated to a low level, and precharge the nodes "a" and "b" to the power voltage VDD and the reference voltage Vref, respectively. A relationship between the power voltage VDD and the reference voltage Vref is VDD>Vref. Accordingly, a bit output Bi (i=1 to m) in a state immediately after the precharge is high level (1).

When the read transistor 302 is turned on after completing the precharge, the node "a" is connected to the anti-fuse element 330. At this time, the sense signal CSN is at a VDD level. When the node "a" is connected to the anti-fuse element 330, a level of the node "a" is changed according to a state of the anti-fuse element 330. That is, when the dielectric breakdown is already generated in the anti-fuse element 330, a current is passed from the node "a" to the anti-fuse element 330. Thus, a potential of the node "a" decreases, and when the sense signal CSN is changed to a VSS level, the bit output Bi is inverted to a low level (0). On the other hand, when the dielectric breakdown is not generated in the anti-fuse element 330, the potential of the node "a" is held at VDD. Thus, even when the sense signal CSN is changed to the VSS level, the bit output Bi holds the high level (1). In this way, the sense circuit 340 is able to read information written in the anti-fuse element 330.

The sense circuit 340 further includes a disable transistor 347 connected between the power voltage VDD and the node "a". The disable transistor 347 turns on when the disable signal Da is active. When the disable transistor 347 turns on, the node "a" is fixed to VDD level regardless of the anti-fuse element 330.

The enable circuit 220, which also is supplied with the enable signal E instead of the bit signal DATAi, has the same circuit configuration as that of the bit-storage circuit 210 shown in FIG. 4 except that the enable circuit 220 outputs the enable signal Ea. The disable circuit 230, which also is supplied with the disable signal D instead of the bit signal DATAi, has the same circuit configuration as that of the bit-storage circuit 210 shown in FIG. 4 except that the sense circuit 340 of the disable circuit 230 has no disable transistor 347 and outputs the disable signal Da.

Thus, a configuration of the semiconductor device is described. An operation of the semiconductor device is described next by focusing on the anti-fuse circuit 31.

The operation of the anti-fuse circuit 31 is mainly divided into: a set operation for temporarily latching the defective address; a write operation for writing the latched defective address to the anti-fuse element; and a sense operation for reading the defective address written in the anti-fuse element. These operations are each performed by entering to the "set mode", the "write mode", and the "sense mode".

The set operation and the write operation are included in a series of test steps performed in a wafer state.

Figure 5:
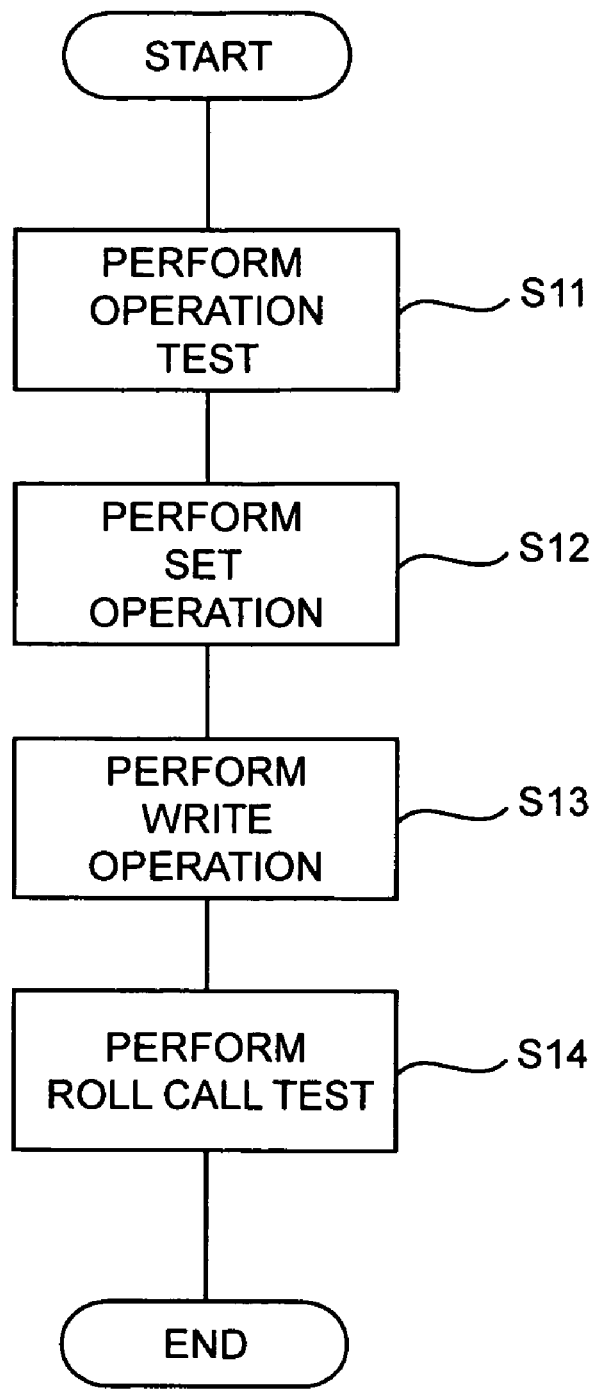
FIG. 5 is a flowchart showing a rough flow of a test steps.

FIG. 5 is a flowchart showing a rough flow of the test steps.

The test steps are performed by using a tester (not shown), and as shown in FIG. 5, writing and reading of data are actually performed at first to detect the defective address, i.e., perform the operation test (step S11). The defective address detected thereby is temporarily stored inside the tester.

Next, the tester transfers the stored defective address to the semiconductor device 10, and causes the latch circuit 320 inside the fuse set 100 to latch the defective address (step S12). At this time, the anti-fuse circuit 31 enters the "set mode" to perform the set operation. Thereafter, the tester causes the anti-fuse element 330 to actually write the defective address latched to the latch circuit 320 (step S13). At this time, the anti-fuse circuit 31 enters the "write mode" to perform the write operation. Thereby, a plurality of defective addresses are respectively stored in the fuse set 100 in a nonvolatile manner. Lastly, a roll call test is performed on the anti-fuse circuit 31 (step S14). Details of the operation at each step S12 to S14 will be described later.

Figure 6:
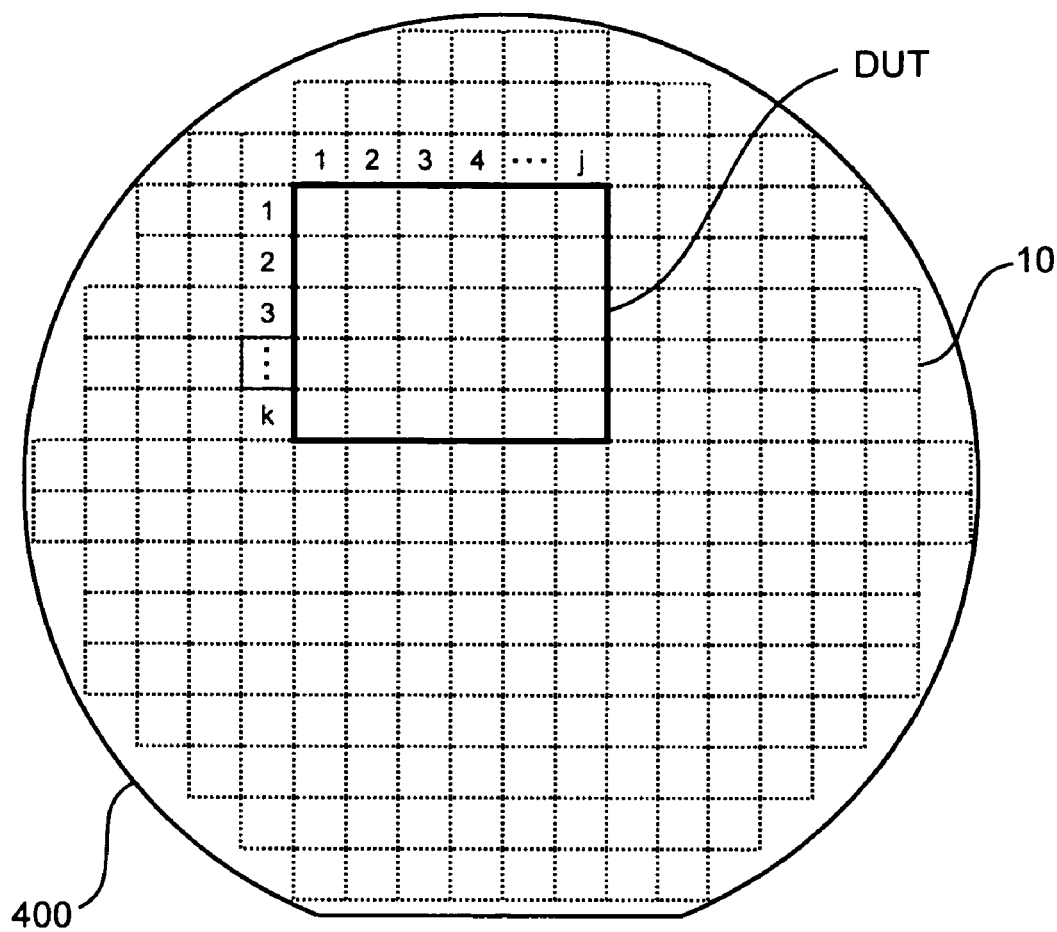
FIG. 6 is a diagram showing a semiconductor wafer and a probe card.
Figure 6:
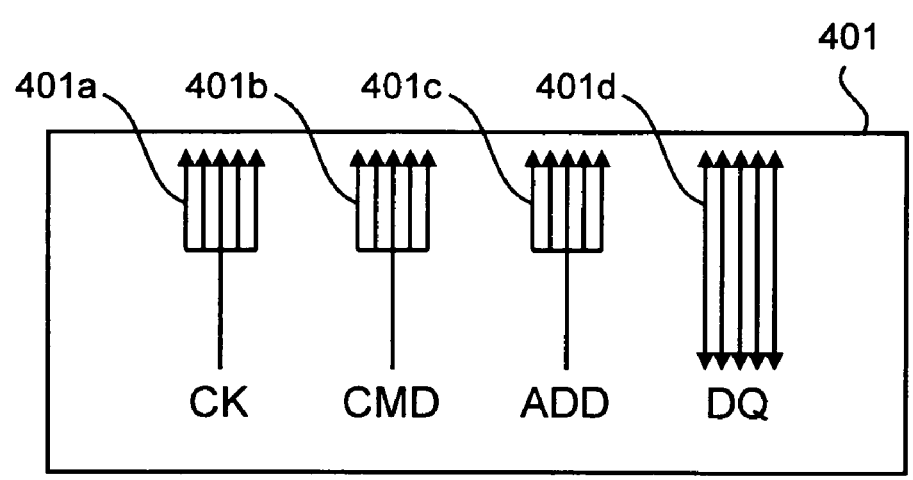

Such test steps are performed at a time of manufacturing in a wafer state. That is, such test steps are performed in parallel on a plurality of semiconductor devices (chips). More specifically, as shown in FIG. 6, out of semiconductor devices included in a semiconductor wafer 400, the operation tests are performed in parallel on j×k semiconductor devices. The j×k semiconductor devices tested in parallel are a so-called DUT (Device Under Test). The number of DUTs relies on a configuration of a probe card 401 arranged in the tester. For example, about 200 semiconductor devices are tested in parallel.

The probe card 401 has a large number of probes to contact each terminal arranged in the semiconductor device which is subject to test. As shown in FIG. 6, a probe 401a that supplies a clock signal CK, a probe 401b that supplies a command signal CMD, and a probe 401c that supplies an address signal ADD are each commonly connected among chips. The reason for this is that in the operation test for detecting the defective address, there is no need of supplying the clock signal CK, the address signal ADD, and the command signal CMD individual for each chip, and it is only necessary to commonly supply these signals to all the chips.

In contrary thereto, input/output data DQ needs to be individual for each chip, and therefore a probe 401*d* that exchanges data DQ is not commonly connected, and individually connected to each chip.

Figure 7:
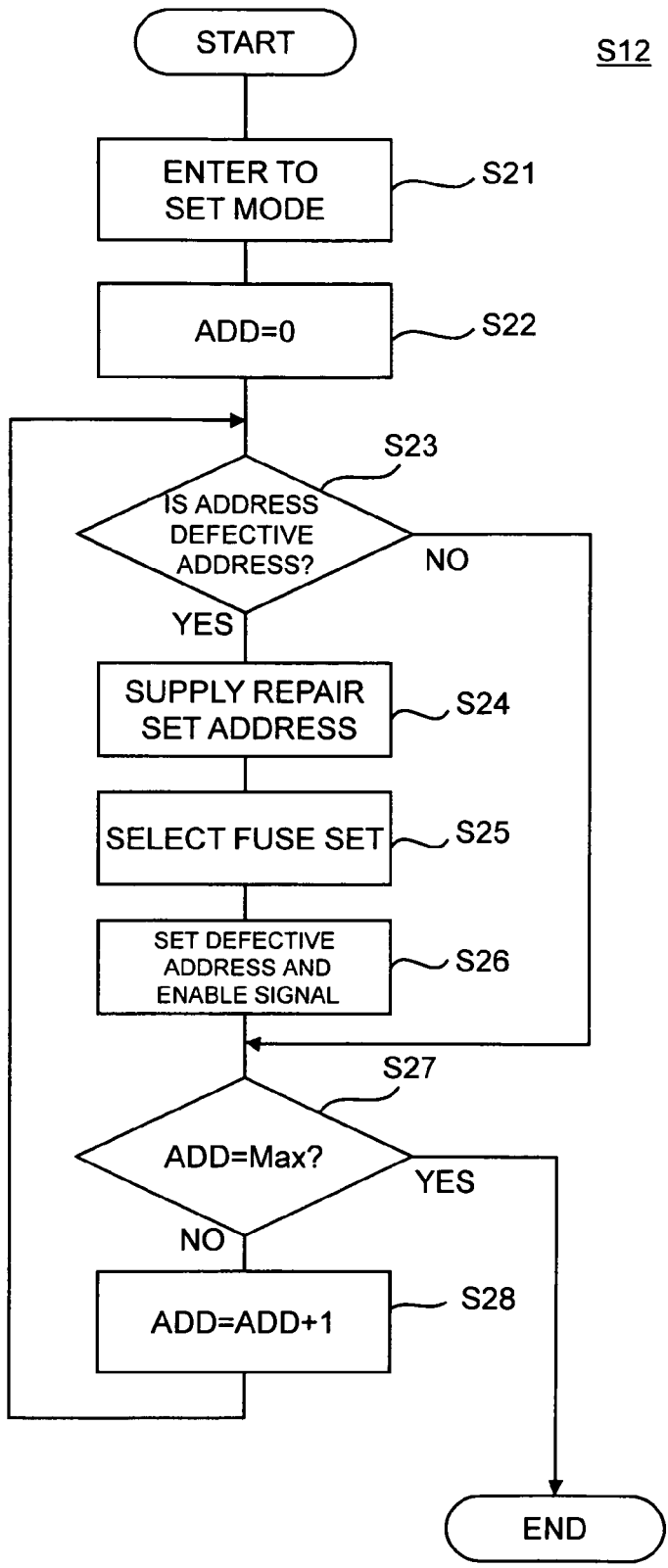
FIG. 7 is a flowchart for explaining a set operation.
Figure 8:
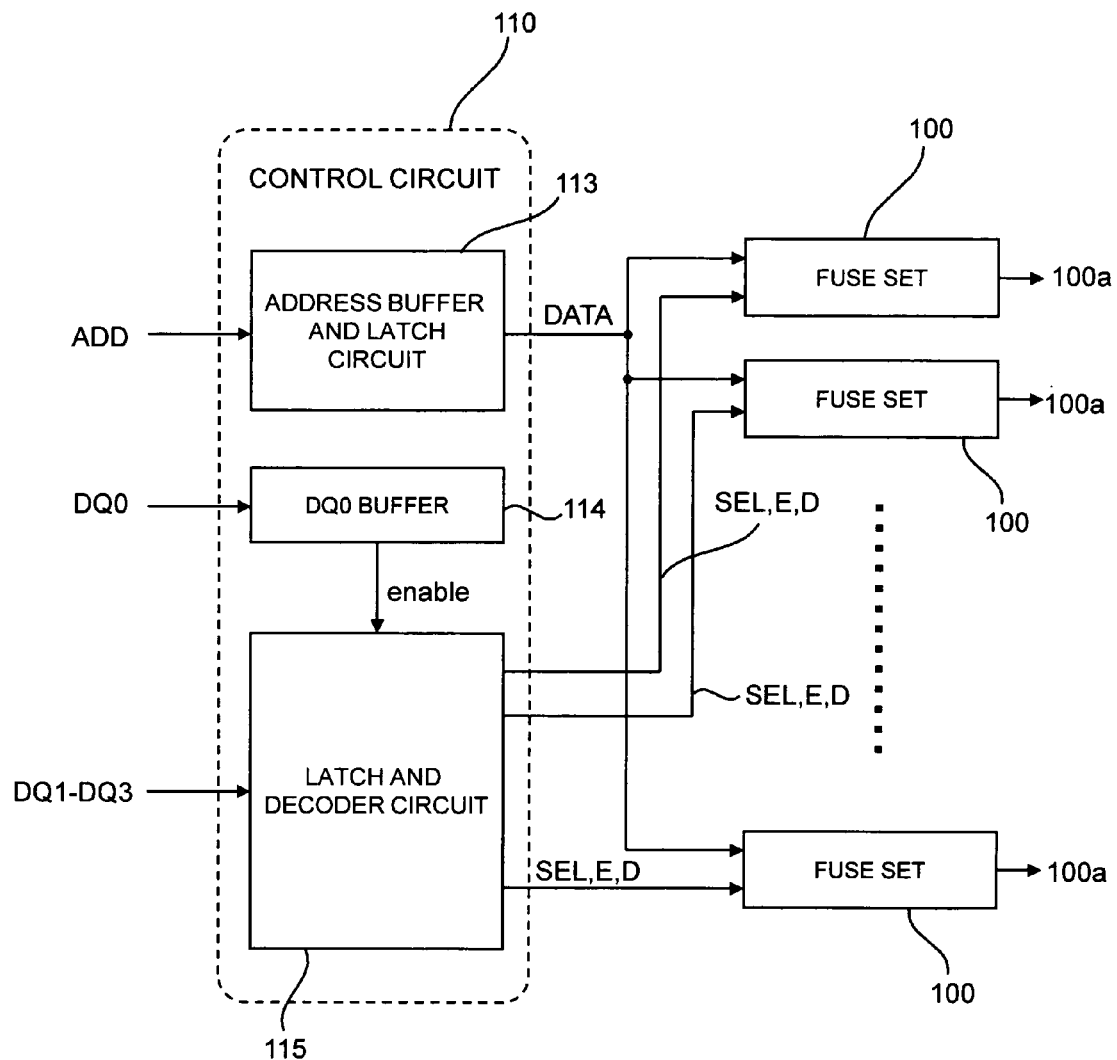
FIG. 8 is a circuit diagram relevant to the set operation.

FIG. 7 is a flowchart for explaining the set operation (step S12). FIG. 8 is a circuit diagram relevant to the set operation.

The set operation is an operation where the detected defective address is transferred from the tester to the semiconductor device 10, and the latch circuit 320 within the fuse set 100 is caused to latch the defective address. As described above, the test steps are performed in parallel on a plurality of chips, and an address signal ADD is commonly supplied to the chips. That is, an individual address signal ADD cannot be supplied to each chip. In contrary thereto, needless to say, the defective address differs depending on each chip.

To solve such a problem, in the present embodiment, the address signal ADD is incremented (or decremented) via the address terminal 22, and at the same time, a data terminal 23 is used to notify of presence of defects to each chip. This is specifically described below.

First, 3 V and 0 V are applied to the external terminals VPPS and VBBS, respectively, and thereby, the anti-fuse circuits 31 of all chips belonging to the same DUT are entered to the "set mode" (step S21). When the set mode is entered, the mode determining circuit 120 sets both the mode signals M1 and M2 to a high level, and in response thereto, the control circuit 110 performs an operation at a time of the set mode.

After entering the control circuit 110 to the set mode, the address signal ADD is set to a minimum value (=0) on a tester side (step S22), and a "repair set address" is supplied to a chip in which the address is the defective address (steps S23 and S24). The repair set address means an address of the fuse set 100 in which the defective address is to be stored. The repair set address needs to be individual for each chip, and thus, to supply these signals, the data DQ via the data terminal 23 is used.

The address signal ADD is supplied to the address buffer and latch circuit 113 included in the control circuit 110. The address signal ADD latched in the circuit 113 is supplied commonly to the plurality of fuse sets 100 as the bits DATA1 to DATA*m*.

The control circuit 110 that receives the repair set address activates the corresponding selection signal SEL, and thereby, a predetermined fuse set 100 is selected (step S25). This brings the selection circuit 310 within the selected fuse set 100 into a conductive state. Specifically, the data signal DQ0 is supplied to the DQ0 buffer 114 included in the control circuit 110 that supplies an enable signal to the latch and decoder circuit 115. The data signals DQ1 to DQ3 are supplied to the decoder circuit 115. The latch and decoder circuit 115 decodes the data signals DQ1 to DQ3 to generate the selection signals SEL. Each selection signal SEL is supplied to an associated one of the fuse sets 100. Thereby one of the fuse sets 100 is selected according to the data signals DQ1 to DQ3.

In this state, each of the bits DATA1 to DATA*m* of the defective address and the enable signal E are supplied to the fuse set 100 (step S26). At this time, the write transistor 301 is kept in an off state. As a result, in the latch circuit 320 within the selected fuse set 100, each of the bits DATA1 to DATA*m* of the defective address and the enable signal E are latched.

Such an operation is performed on all the addresses by incrementing the address signal ADD (step S28). Subsequently, when the address signal ADD reaches a maximum value (ADD=Max) incrementing of all the addresses is completed (step S27: YES). Thus, a series of set operations are completed. As a result of the operations, all the defective addresses are latched to the fuse set 100. To the enable circuit 220 of the fuse set 100 in which the defective address is latched, the enable signal E is latched.

A time required for a 1-address process in the set operation, i.e., a time required for the operations from step S23 to step S28 shown in FIG. 7, is in the order of nanoseconds. As one example, provided that the time required for a 1-address process is 14 nanoseconds and a total number of addresses is 34000, a time required for completing the set operation is about 0.48 second. That is, for all the chips belonging to the same DUT, the set operation can be completed in 0.48 second.

Figure 9:
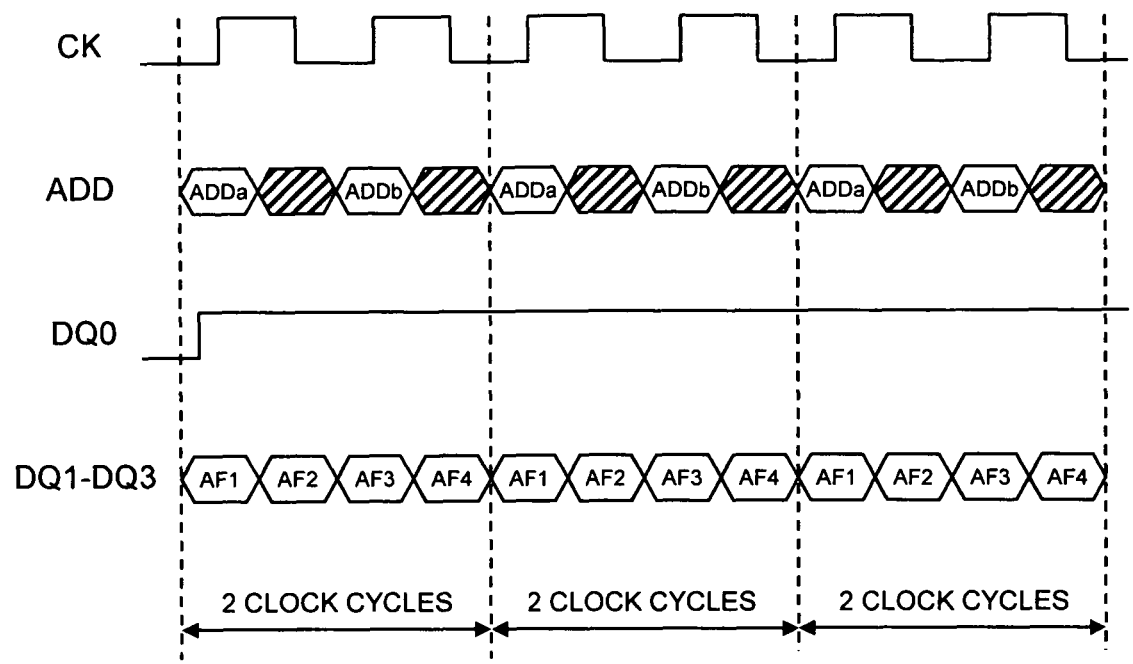
FIG. 9 is a timing chart showing one example of a change of each signal at a time of the set operation.

FIG. 9 is a timing chart showing one example of a change of each signal at a time of the set operation.

In an example shown in FIG. 9, the address is incremented in a 2-clock cycle. More specifically, in response to a first rising edge of the clock signal CK, a first half (ADDa) of the address signal ADD is inputted, and in response to a second rising edge, a second half (ADDb) of the address signal ADD is inputted.

On the other hand, in the repair set address, four terminals, out of a plurality of data terminals 23, are used, and out of these, a bit DQ0 is used as the enable signal. See FIG. 9. The bit DQ0 is high active, and when a high level is maintained in an entire period of the 2-clock cycle, which is a target cycle, the selection of the chip becomes valid, and the anti-fuse circuit 31 generates the enable signal E. On the other hand, remaining 3-bits DQ1 to DQ3 are fetched for a total of four times at both edges of the clock signal CK. As a result of the 4-timefetching (AF1 to AF4), the repair set address is designated. As described above, the repair set address designated by the bits DQ1 to DQ3 is used for selecting the fuse set 100.

Figure 10:
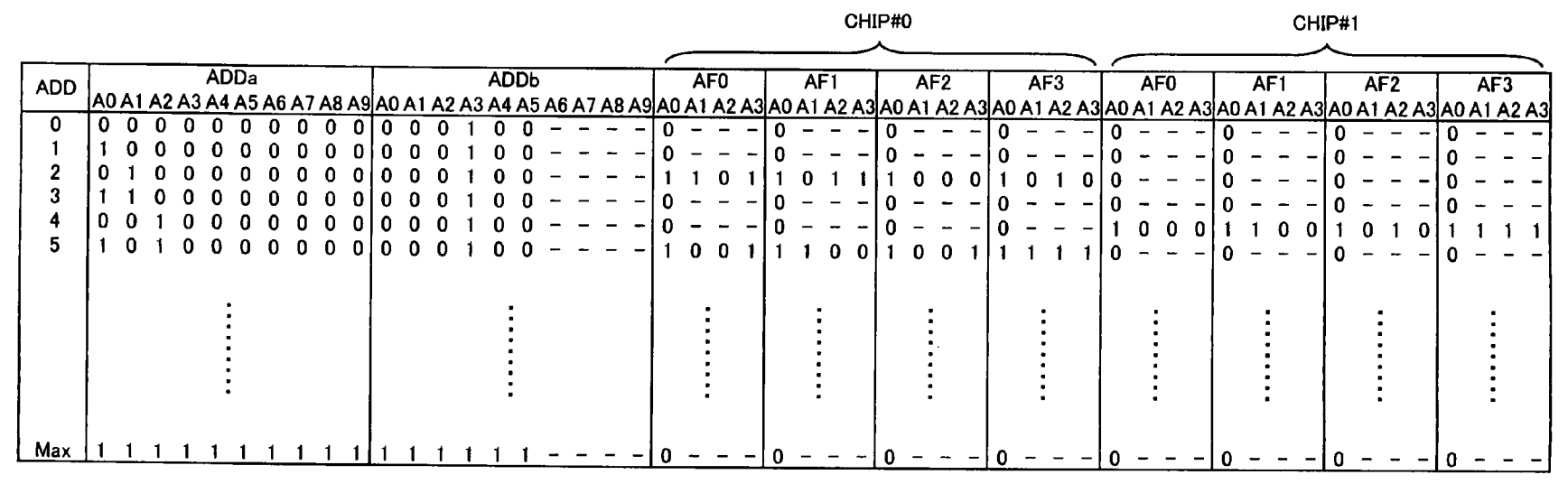

FIG. 10 is a table of one example of a change of each signal at a time of the set operation.

In an example shown in FIG. 10, both the first half ADDa of the address signal ADD and the second half ADDb thereof are 10 bits. A row address (or a column address) is designated by 13 bits formed of 10 bits (A0 to A9) of the first half ADDa inputted for the first time and three bits (A0 to A2) of the second half ADDb inputted for the second time, and a bank address is designated by two bits formed of bits A4 and A5 of the second half ADDb. The bit A3 of the second half ADDb is an enable bit, and set to a high level (1) all the time at a time of the set operation. The remaining bits A6 to A9 are not used. These address signals ADD are applied commonly to all the chips belonging to the same DUT.

As described above, the repair set address corresponding to each address differs depending on each chip, and when the bit DQ0 for enabling is at a high level (1), the other bits DQ1 to DQ3 are valid. In an example shown in FIG. 10, a chip #0 is enabled at addresses #2 and #5 and a chip #1 is enabled at an address #4.

According to the set operation, an arbitrary defective address can be set in parallel for the individual chips.

Figure 11:
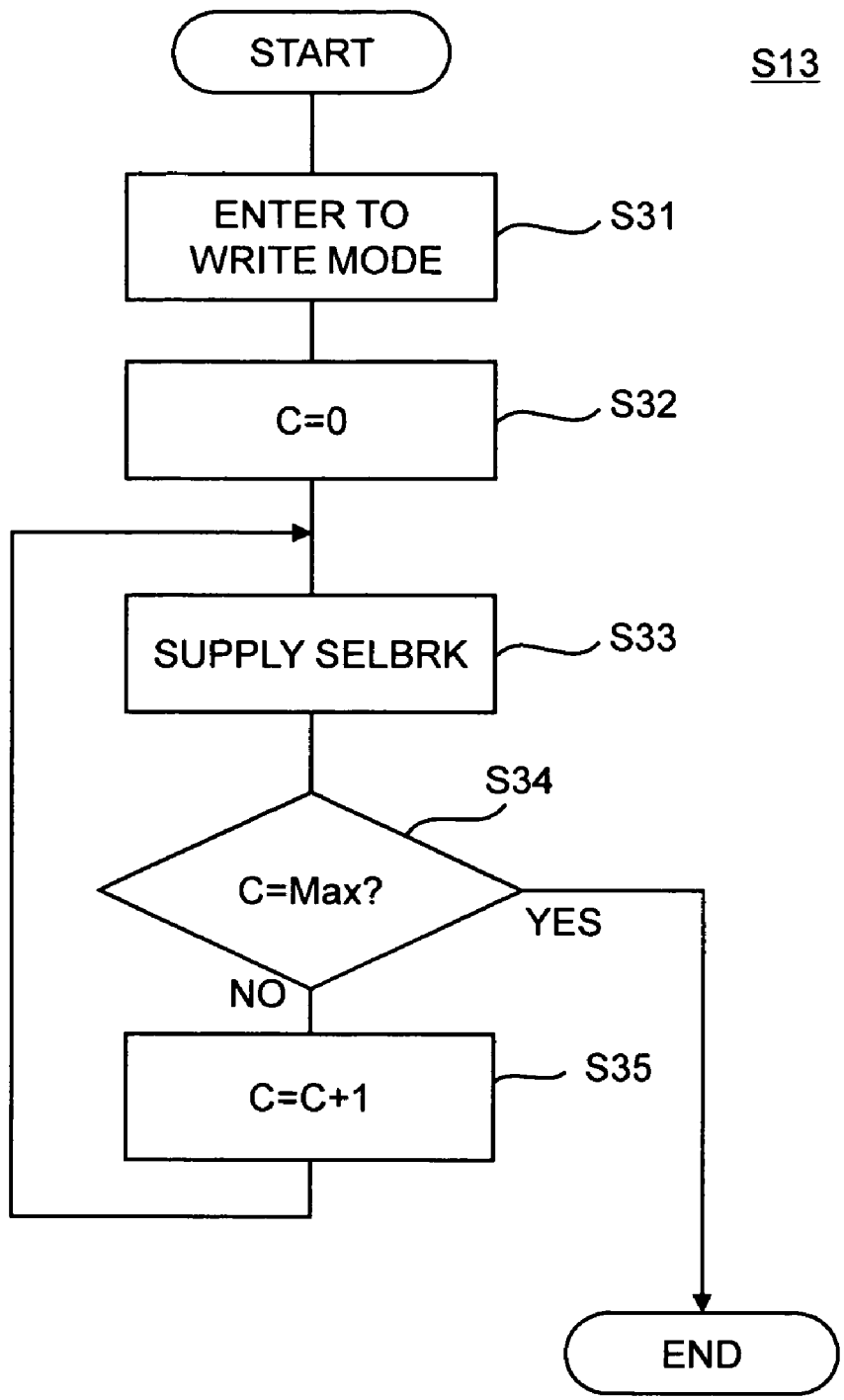
FIG. 11 is a flowchart for explaining a write operation.

FIG. 11 is a flowchart for explaining the write operation (step S13). In the write operation, the defective address temporarily latched to the latch circuit 320 is written to the anti-fuse element 330.

First, 4 V and −2 V are applied to the external terminals VPPS and VBBS, respectively, and thereby, the anti-fuse circuits 31 of all chips belonging to the same DUT are entered to the "write mode" (step S31). When the write mode is entered, the mode determining circuit 120 sets the mode signal M1 to a high level and sets the mode signal M2 to a low level, and in response thereto, the control circuit 110 performs an operation at a time of the write mode.

Figure 12:
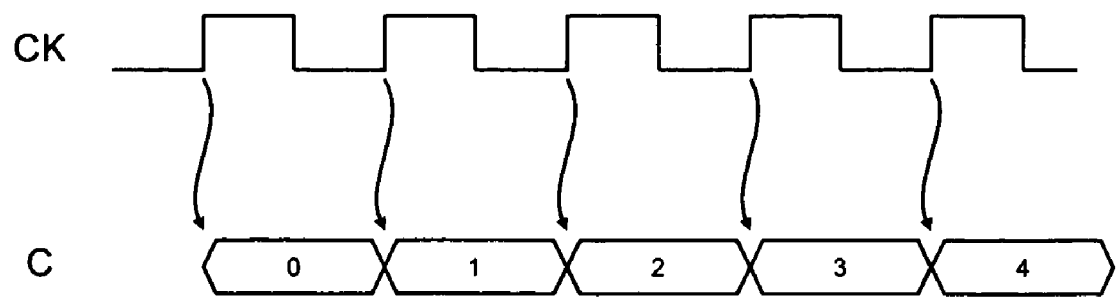
FIG. 12 is a timing chart for indicating a transition of a count value.

The tester periodically changes the clock signal CK, as shown in FIG. 12, after entering the control circuit 110 to the write mode. When the write mode is entered, the control circuit 110 increments an internal counter 111 in synchronization with the clock signal CK. Count values C of the internal counter 111 respectively indicate the corresponding fuse set 100, and accordingly, every time the count values C change, the different fuse set 100 is selected. The count values C are set to 0 as an initial value (step S32)

The control circuit 110 supplies a write signal SELBRK to the fuse set 100 selected by the count value C, in a period during which the clock signal CK is at a high level (step S33). Thereby, in a period during which the clock signal CK is at a high level, the write transistor 301 is turned on. At this time, the read transistor 302 is kept in an off state.

At a time of the write operation, the source/drain 332 of the anti-fuse element 330 is supplied with the voltage VBBSV (−2 V). As a result, when the write transistor 301 is turned on, out of the anti-fuse elements 330 included in the fuse set 100, in the anti-fuse element 330 latched at a high level (1) to the corresponding latch circuit 320, voltage of 6 V (=4 V+2 V) is applied to the gate insulating film. Thereby, the dielectric breakdown is generated in the anti-fuse element 330. As a result, its state is irreversibly transitioned from a non-conductive state to a conductive state. On the other hand, out of the anti-fuse elements 330 included in the fuse set 100, in the anti-fuse element 330 latched at a low level (0) to the corresponding latch circuit 320, voltage of 2 V (=0 V+2 V) only is applied to the gate insulating film, and thus the gate insulating film is not broken. That is, the anti-fuse element 330 is kept in a non-conductive state.

Thereby, the defective address temporarily held by using the latch circuit 320 is recorded in the anti-fuse element 330 in a nonvolatile manner. The writing to the anti-fuse element 330 requires a longer time (for example, 5 ms) as compared to the writing to the latch circuit 320.

Such an operation is performed on all the fuse sets 100 by incrementing the internal counter 111 in synchronization with the clock signal CK (step S35). Subsequently, when the count value C of the internal counter 111 reaches a maximum value, the writing processes on all the fuse sets 100 are completed (step S34: YES). Thus, a series of write operations are completed. Accordingly, when the number of fuse sets 100 included in the anti-fuse circuit 31 is 1000, for example, the write operations on all the chips belonging to the same DUT are completed in about 5 seconds (=5 ms×1000).

In this case, the reason for performing the write operation on each fuse set 100 is to take into consideration a limit on a current amount supplied by the tester. Accordingly, when the current amount by which the tester can supply is large to some extent, the write operations can be simultaneously performed on a plurality of fuse sets 100 included in one chip. According to the configuration, a series of write operations can be completed at a higher speed.

Figure 13:
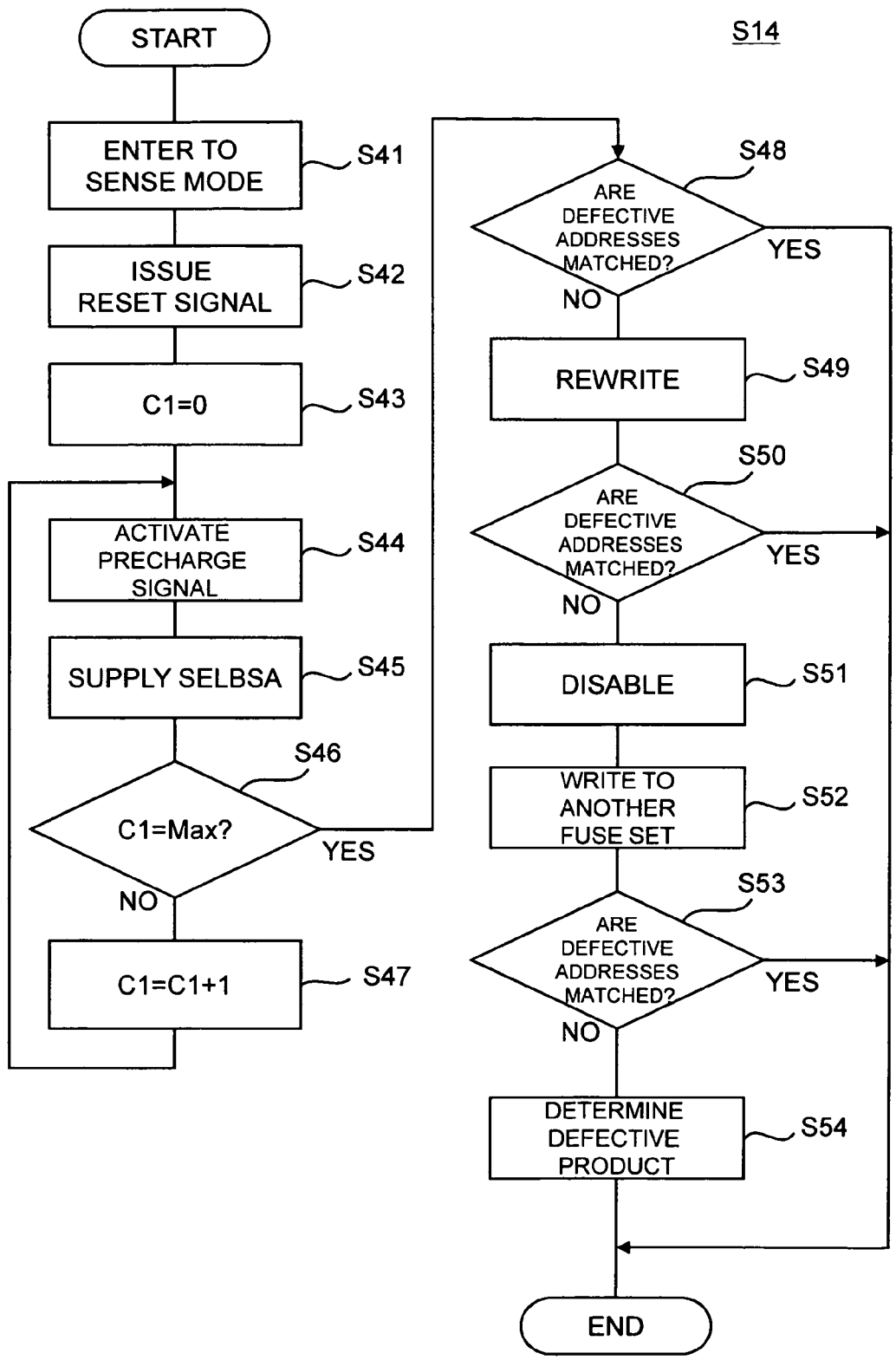
FIG. 13 is a flowchart for explaining a roll call test.

FIG. 13 is a flowchart for explaining the roll call test (step S14). In the roll call test, whether the defective address is correctly written to each fuse set 100 is determined.

First, the external terminals VPPS and VBBS are brought to an opened state, and thereby, the anti-fuse circuits 31 of all the chips belonging to the same DUT are entered to the "sense mode" (step S41). When the sense mode is entered, the mode determining circuit 120 sets the mode signal M1 to a low level and sets the mode signal M2 to a high level. In response thereto, the control circuit 110 performs an operation at a time of the sense mode.

Figure 14:
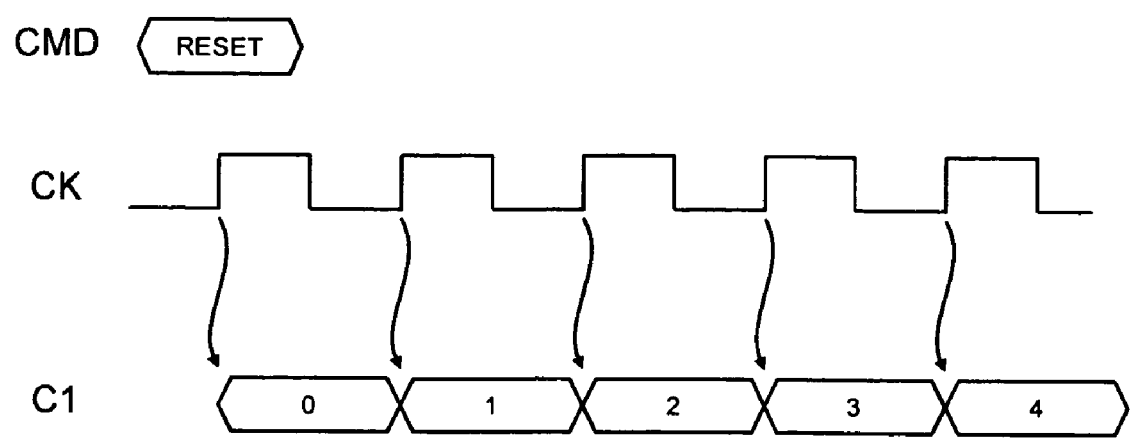
FIG. 14 is a timing chart for indicating a transition of a count value.

The tester supplies each chip with a reset signal RESET, as shown in FIG. 14, after entering the control circuit 110 to the sense mode (step S42). The reset signal RESET is a predetermined combination of command signals CMD, and accordingly, supplied to the command terminal 21.

When the reset signal RESET is supplied during a time that the sense mode is being entered, the control circuit 110 increments an internal counter 112 in synchronization with the clock signal CK. Count values C1 of the internal counter 112 are set to 0 as an initial value (step S43).

The count values C1 of the internal counter 112 respectively indicate a plurality of fuse sets 100, and accordingly, each time the count values C1 change, the different fuse sets 100 are selected. The number of fuse sets 100 selected by one count value C1 is not particularly limited. For example, about 32 fuse sets 100 can be selected. When the number of fuse sets 100 selected by one count value C1 is set to a power of 2, necessity of additionally arranging the internal counter 112 is eliminated, and it is only necessary to use a high-order bit of the internal counter 111 in this case.

The control circuit 110 then sets the precharge signal PRE to a low level for a predetermined period, and precharges the sense circuit 340 (step S44). As described above, the relationship between the power voltage VDD and the reference voltage Vref is VDD>Vref. Accordingly, the bit output Bi (i=1 to m) and the enable signal Ea in a state immediately after the precharge are high level (1).

After the completion of the precharge, the control circuit 110 supplies the fuse sets 100 selected by the count value C1 with the sense signals SELBSA (step S45). Thereby, the read transistors 302 within the selected fuse sets 100 are turned on, and the node "a" of the sense circuit 340 is connected to the anti-fuse element 330. At this time, the write transistor 301 is kept in an off state.

As a result, in a case of the dielectric breakdown of the anti-fuse element 330, a current is passed from the node "a" to the anti-fuse element 330, and thus a potential of the node "a" decreases and the bit output Bi and the enable signal Ea are inverted to a low level (0). In contrary thereto, in a case of no dielectric breakdown of the anti-fuse element 330, the potential of the node "a" is held at VDD, and thus the bit output Bi and the enable signal Ea hold a high level (1).

As described above, the defective address and the enable signal Ea written in the selected fuse sets 100 are read. Such an operation is performed on all the fuse sets 100 by incrementing the internal counter 112 in synchronization with the clock signal CK (step S47). Subsequently, when the count value C1 of the internal counter 112 reaches a maximum value, the sense operations on all the fuse sets 100 are completed (step S46: YES). A series of sense operations are thus completed.

The defective addresses thus read are supplied to the tester (not shown), and are compared with the defective addresses detected in the operation test (step S11). When as a result of the comparison, the both addresses all match (step S48: YES), the roll call test is ended. Contrary thereto, when at least one portion of the addresses does not match (step S48: NO), the breaking of the anti-fuse element 330 is insufficient. Therefore, rewriting is performed on the same fuse set 100 (step S49).

Thereafter, the roll call is performed once again, and the defective addresses are compared with the defective addresses stored within the tester. When as a result of the comparison, the both addresses all match resulting from a successful rewriting (step S50: YES), the roll call test is ended. In contrast, when there remains even one unmatched address (step S50: NO), the writing to the fuse set 100 is aborted, and the writing to the anti-fuse element 330 included in the disable circuit 230 is performed (step S51). Thereby, the disable signal Da is activated so as to invalidate the sense circuits 340 included in the bit-storage circuits 210 and the enable circuit 220. Hence, the fuse set 100 is invalidated.

The defective addresses to be written to the invalidated fuse set 100 are then written to another fuse set 100 in an unused state (step S52). Thereafter, the roll call is performed once more again, and the defective addresses are compared with the defective addresses stored in the tester. As a result, when the both addresses all match resulting from a successful alternate writing (step S53: YES), the roll call test is ended. In contrast, when there remains even one unmatched address (step S53: NO), the chip is treated as a defective product (step S54).

As described above, in the present embodiment, in addition to the enable circuit 220 that validates the fuse set 100, the disable circuit 230 that invalidates the same is provided. Thus, even when the rewriting is unsuccessful, rather than immediately abandoning the chip, the alternate writing to the other fuse set 100 that is in an unused state becomes possible. This permits an improvement of a product yield.

The operations performed in a series of test steps are as described above.

According to the present embodiment, all the defective addresses are latched in the set operation (step S12), and thereafter, the write operation on the anti-fuse element 330 is actually performed (step S13). As a result, time-consuming write operations can be performed in parallel on a plurality of chips. Thereby, a write time to the anti-fuse element 330 can be greatly shortened.

Besides, in the set operation (step S12), the repair set address is supplied by using the data DQ while incrementing the address signal ADD, and thus the different defective address can be set to each chip. As a result, it becomes possible to use the normal probe card 401 to which the probe 401c that supplies the address signal ADD is commonly connected.

The fuse set 100 in which a write defect is discovered in the roll call test (step S14) can be eventually invalidated by activating the disable circuit 230. Thereby, the alternate writing to the unused fuse set 100 can be possible, and thus it becomes possible to improve the product yield.

As described above, in the actually used state, the external terminals VPPS and VBBS are in an opened state, and accordingly, the sense mode is set all the time. Accordingly, when the reset signal RESET is issued at a time of inputting a power supply or at a time of resetting, the processes at step S43 to step S47 shown in FIG. 13 are performed, and the defective address RADD written in each fuse set 100 is read. Thereafter, the read defective address RADD is supplied to the address comparing circuit 32 shown in FIG. 1, and by the controls by the address comparing circuit 32 and the access control circuit 12, the normal cell 11a having a defect is replaced by the redundant cell 11b. Thereby, the defective address is repaired.

The present invention is in no way limited to the aforementioned embodiments, but rather various modifications are possible within the scope of the invention as recited in the claims, and naturally these modifications are included within the scope of the invention.

For example, in the present embodiment, all the defective addresses are latched in the set operation (step S12), and thereafter, the write operation to the anti-fuse element 330 is actually performed (step S13). However, the present invention is not limited thereto. Accordingly, the latch circuit 320 can be omitted, and in this state, the writing to the anti-fuse element 330 can be actually performed at a time of the set operation.

Further, in the present embodiment, the repair set address is supplied by using the data DQ while incrementing the address signal ADD. However, the present invention is not limited thereto. Accordingly, the supplying the defective address and the repair set address can be performed by another method.

Furthermore, in the present embodiment, when the disable circuit 230 is arranged in each fuse set 100, the enabled fuse set 100 can be invalidated. However, in the present invention, the arrangement of such a disable circuit 230 is not essential.

Further, in the present embodiment, for the anti-fuse element 330, a gate-breaking anti-fuse element having the same configuration as that of an MOS transistor is used. However, in the present invention, a specific configuration of the anti-fuse element is not particularly limited. Accordingly, for example, a capacity-breaking anti-fuse element having the same configuration as that of a DRAM cell capacitor can be used.

What is claimed is:

1. A semiconductor device having an anti-fuse circuit, the anti-fuse circuit comprising:
   an anti-fuse element that comprises a transistor and permanently stores data;
   a latch circuit that temporarily stores data to be written into the anti-fuse element; and
   a write transistor connected between the latch circuit and the anti-fuse element, an output of the latch circuit being supplied via the write transistor to a gate of the transistor of the anti-fuse element.

2. The semiconductor device as claimed in claim 1, the anti-fuse circuit further comprising:
   a control circuit that controls at least the write transistor, wherein
   the control circuit brings the write transistor into an off state during the latch circuit temporarily storing the data and brings the write transistor into an on state at a time of writing the data stored in the latch circuit into the anti-fuse element.

3. The semiconductor device as claimed in claim 2, the anti-fuse circuit further comprising:
   a sense circuit that reads data stored in the anti-fuse element; and
   a read transistor connected between the anti-fuse element and the sense circuit, wherein
   the control circuit brings the read transistor into an on state at a time of reading the data stored in the anti-fuse element.

4. The semiconductor device as claimed in claim 3, wherein the write transistor and the read transistor have the gate insulating films that are thicker than a gate insulating film of the anti-fuse element.

5. The semiconductor device as claimed in claim 2, the semiconductor device having a plurality of fuse sets each includes a plurality of bit-storage circuits, each of which has the latch circuit and the anti-fuse element, wherein
   the control circuit causes one of the fuse sets designated by a repair set address supplied from outside to latch a defective address supplied from outside.

6. The semiconductor device as claimed in claim 5, wherein each of the fuse sets includes:
   an enable circuit that validates a defective address stored in the bit-storage circuits belonging to the same fuse set; and
   a disable circuit that invalidates the defective address stored in the bit-storage circuits belonging to the same fuse set.

7. The semiconductor device as claimed in claim 6, wherein the enable circuit has a circuit configuration substantially identical to that of each bit-storage circuit.

8. The semiconductor device as claimed in claim 5, further having:
   address terminals to which the defective address is supplied from outside; and
   data terminals to which the repair set address is supplied from outside.

9. A semiconductor device having an anti-fuse circuit, address terminals and data terminals, the anti-fuse circuit comprising:
   a plurality of fuse sets including an anti-fuse element that permanently stores data; and
   a control circuit that writes a defective address supplied via the address terminals into one of the fuse sets designated by a repair set address supplied via the data terminals.

10. The semiconductor device as claimed in claim 9, wherein the repair set address is designated by a plurality of data supplied at a different time from each other.

11. The semiconductor device as claimed in claim 9, wherein the defective address is designated by a plurality of address signals supplied at a different time from each other.

12. The semiconductor device as claimed in claim 9, wherein each fuse set includes:
   a plurality of bit-storage circuits that store the defective address;
   an enable circuit that validates the defective address stored in the bit-storage circuits; and
   a disable circuit that invalidates the defective address stored in the bit-storage circuits.

13. The semiconductor device as claimed in claim 12, wherein the enable circuit has a circuit configuration substantially identical to that of the bit-storage circuit.

14. The semiconductor device as claimed in claim 9, further comprising:
   a memory cell array including a plurality of cells to store data and a plurality of redundant cells one of which is replaced with a defective cell of the cells,
   wherein the address terminals comprise terminals to which an address addressing one of the cells is supplied from outside of the semiconductor device, and
   wherein the data terminals comprise terminals to which data being written into the addressed one of the cells is supplied from the outside of the semiconductor device.

15. The semiconductor device as claimed in claim 14, wherein the defective address comprises an address addressing the defective cell of the cells, the defective address being supplied via the address terminals from outside of the semiconductor device,
   wherein the repair set address comprises an address addressing one of the fuse sets, the repair set address being supplied via the data terminals from outside of the semiconductor device, and the data terminals to which the repair set address supplied are different from the address terminals to which the defective address is supplied, and
   wherein the control circuit selects one of the fuse sets in response to receiving the repair set address being supplied via the data terminals anal writes the defective address being supplied via the address terminals into the selected one of the fuse sets.

16. A semiconductor device having an anti-fuse circuit, the anti-fuse circuit comprising:
   a plurality of fuse sets each includes an anti-fuse element that permanently stores data, wherein each of the fuse sets includes:
   a plurality of bit-storage circuits that store a defective address; and
   a disable circuit that invalidates the defective address stored in the bit-storage circuits.

17. The semiconductor device as claimed in claim 16, wherein each of the fuse sets further includes an enable circuit that validates the defective address stored in the bit-storage circuits.

18. The semiconductor device as claimed in claim 17, wherein the enable circuit has a circuit configuration substantially identical to that of the bit-storage circuit.

19. The semiconductor device as claimed in claim 18, wherein the anti-fuse circuit further comprises a control circuit that activates the enable circuit included in one of the fuse sets in which the defective address is to be written and activates the disable circuit included in one of the fuse sets in which writing of the defective address is unsuccessful.

20. The semiconductor device as claimed in claim 16, further having:
   address terminals to which the defective address is supplied from outside; and
   data terminals to which a repair set address for selecting the fuse sets is supplied from outside.

21. A method of writing a defective address into an anti-fuse circuit, the method comprising:
   providing an anti-fuse circuit having an anti-fuse element that comprises a transistor and permanently stores data, a latch circuit that temporarily stores data to be written into the anti-fuse element, and a write transistor connected between the latch circuit and the anti-fuse element;
   detecting the defective address by an operation test;
   latching the detected defective address to the latch circuit; and
   writing the defective address latched to the latch circuit into the anti-fuse element, an output of the latch circuit being supplied via the write transistor to a gate of the transistor of the anti-fuse element.

22. A method of writing a defective address into an anti-fuse circuit having a plurality of fuse sets including an anti-fuse element that permanently stores data and a control circuit that writes the defective address supplied via address terminals into one of the fuse sets designated by a repair set address supplied via data terminals, the method comprising:
   incrementing or decrementing an address supplied to the address terminal; and
   supplying the data terminal with the repair set address when the address is the defective address.

23. The method of writing a defective address into an anti-fuse circuit as claimed in claim 22, further comprising,
   providing the defective address via the address terminals to a semiconductor device, wherein the defective address comprises an address addressing an defective cell of cells of the semiconductor device and wherein the address terminals are terminals to which an address addressing one of the cells is supplied from outside of the semiconductor device; and
   providing a repair set address via the data terminals to the semiconductor device, wherein the repair set address comprises an address addressing one of the fuse sets and is supplied via the data terminals from the outside of the semiconductor device, and wherein the data terminals comprise terminals to which data being written into the addressed one of the cells is supplied from the outside of the semiconductor device, and wherein the data terminals to which the repair set address is supplied are different from the address terminals to which the defective address is supplied.

24. A method of writing a defective address in an anti-fuse circuit, the method comprising:

providing an anti-fuse circuit having a plurality of fuse sets, each of the fuse sets including:

a plurality of bit-storage circuits that store the defective address, the plurality of bit-storage circuits including an anti-fuse element permanently stores data;

an enable circuit that validates the defective address stored in the bit-storage circuits; and a disable circuit that invalidates the defective address stored in the bit-storage circuits;

activating the enable circuit included in one of the fuse sets in which the defective address is to be written; and activating the disable circuit included in one of the fuse sets when writing of the defective address is unsuccessful.

25. The method of writing an address to the anti-fuse circuit as claimed in claim 24, the method further comprising writing into another fuse set the defective address to be written to the fuse set that activates the disable circuit.

26. The method of writing an address to the anti-fuse circuit as claimed in claim 24, further comprising:

writing the defective address; and rewriting the defective address when the writing of the defective address is unsuccessful.

* * * * *